(12) United States Patent
Espiau De Lamaestre et al.

(10) Patent No.: US 8,884,271 B2
(45) Date of Patent: Nov. 11, 2014

(54) PHOTODETECTION DEVICE (75) Inventors: Roch Espiau De Lamaestre, Grenoble (FR); Christophe Largeron, Brignoud (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/994,301

(22) PCT Filed: Dec. 16, 2011

(86) PCT No.: PCT/IB2011/055742
§ 371 (c)(1),
(2), (4) Date: Jun. 14, 2013

(87) PCT Pub. No.: WO2012/080989
PCT Pub. Date: Jun. 21, 2012

(65) Prior Publication Data
US 2013/0264543 A1    Oct. 10, 2013

(30) Foreign Application Priority Data
Dec. 17, 2010 (FR) .................... 10 60711

(51) Int. Cl.
*H01L 29/06* (2006.01)
*H01L 31/0232* (2014.01)

(52) U.S. Cl.
CPC ...... *H01L 31/02327* (2013.01); *H01L 31/0232* (2013.01)
USPC ...... 257/21; 257/9; 257/15; 257/80; 257/440; 257/443

(58) Field of Classification Search
None
See application file for complete search history.

(56) References Cited

U.S. PATENT DOCUMENTS 8,618,622 B2 * 12/2013 Espiau De Lamaestre et al. .............................. 257/431
2006/0000976 A1    1/2006 Brouns

FOREIGN PATENT DOCUMENTS

WO    2005/081782    9/2005

OTHER PUBLICATIONS

Dupont E., "Optimization of . . . infrared photodetectors", Journal of Applied Physics, American institute of Physics, New York, US., vol. 88, No. 5, Sep. 1, 2000, XP012051482.
Yu A Goldberg, "Aluminum Galluim Arsenide (Al_xGa_1-xAs)", XP002665500, Nov. 1996.
M. Levinshtein et al., Handbook Series on Semiconductor Parameters, Dec. 9, 2011.

* cited by examiner

*Primary Examiner* — Kyoung Lee
(74) *Attorney, Agent, or Firm* — Clark & Brody (57) ABSTRACT

The present invention relates to a photodetector for detecting an infrared-light emission having a given wavelength ($\lambda$) comprising a multilayer with: a layer (11) of a partially absorbent semiconductor; a spacer layer (12) made of a material that is transparent to said wavelength; and a structured metallic mirror (13), the distance (g) between the top of said mirror and said spacer layer being smaller than $\lambda$ and said mirror comprising a network of holes defining an array of metallic reliefs with a pitch P of between 0.5 $\lambda$/nSC and 1.5 $\lambda$/nSC, where nSC is the real part of the refractive index of the semiconductor, a relief width L of between 9P/10 and P/2 and a hole depth h of between $\lambda$/100 and $\lambda$/15.

10 Claims, 4 Drawing Sheets

PHOTODETECTION DEVICE

The invention relates to a photodetector device and especially to an infrared photodetector.

Such a device comprises an absorbent semiconductor layer having a set thickness.

Quantum infrared photodetectors are already known. These photodetectors must be cooled to far below room temperature in order to minimize or even eliminate in the semiconductor the process of carrier generation, or dark current, which competes with photogeneration of free carriers, or the useful signal.

Decreasing the temperature of the detector is therefore a means frequently used in the prior art to maximize signal-to-noise ratio.

When the semiconductor used in the photodetector is mercury cadmium telluride, the semiconductor layer is a number of microns in thickness, thereby ensuring maximum absorption of the infrared light.

Decreasing the volume of semiconductor present in the photodetector also reduces the dark current. Decreasing the thickness of the semiconductor layer has other advantages: it reduces the cost of materials and increases detection speed.

However, this decrease in the thickness of the semiconductor layer results in a decrease in the quantum efficiency of the photodetector, which is undesirable, because this decrease in efficiency results in a decrease in the signal-to-noise ratio.

This is why a photon concentrator is conventionally associated with the photodetector, in order to compensate for the loss of quantum efficiency of the photodetector and therefore to be able to benefit from the decrease in dark current in order to obtain a good signal-to-noise ratio.

This structure may especially take the form of a structured metal mirror that is placed on the back side of an absorbent semiconductor layer, so as to strengthen absorption in this semiconductor layer.

Such a mirror may especially be used in quantum well detectors, in the mid- and far-infrared spectral range. The reader may refer to the article by K. W. Goossen et al., Appl. Phys. Lett. 53, 19 Sep. 1988, 1027. This article describes a detector comprising a stack of layers forming quantum wells. The detector does not absorb at normal incidence. The mirror allows the incident wave to be reflected with an angle so that it is absorbed by at least one quantum well. It has also been suggested to use such a mirror to improve the efficiency of amorphous-Si thin-film solar cells in the visible and near infrared.

In any case, a structured metal mirror makes it possible to couple the incident radiation to the absorbent semiconductor layer by diffraction.

Thus, the metal mirror may be structured in the form of a two-dimensional array, especially an array of pads in various configurations, for example a square array of square pads or a square or hexagonal array of round pads.

The geometric features of these arrays have been the subject of optimization studies regarding the effectiveness of the strengthening of the absorption.

Thus, certain studies suggest making the height of the pads or holes in the mirror used about a quarter of the operational wavelength in order to optimize the absorption of the quantum wells. Mention may especially be made to document WO 2005/081782 or even to the article by J. Y. Andersson et al., Appl. Phys. Lett. 59, 12 Aug. 1991, 857.

This results in a mirror of a substantial thickness when the photodetector is used in the infrared.

Thus, with a material with a refractive index of 2.5 coating the structures of the array, the structures will have a depth of about 400 nm for a wavelength of 4 µm. This results in mirrors with a thickness of about 500 nm, this thickness being measured between the bottom of the mirror and the top of the structures.

This substantial thickness may cause a certain number of technological difficulties in production.

It is, for example, difficult to structure metal materials with such thicknesses because, for example, of problems with deposition on the sides of the resist used in lift-off processes, of problems with filling deep cavities, or of problems with etching noble metals such as gold using high-temperature (typically temperatures above 200° C.) plasma-based processes.

Certain studies suggest using thinner structures, with holes that are 200 nm in depth for a wavelength of 10 µm, this structure allowing absorption in a quantum well detector to be strengthened. This is the case for the article by K. W. Goossen cited above and the article by Cui Dafu et al. Infrared Phys. 32 (1991) 53.

However, the quantum efficiency of these photodetectors, like that of the aforementioned photodetectors, depends considerably on the angle of incidence of the light on the photodetector. Thus, the absorption spectrum of the semiconductor layer present in the photodetector exhibits a resonant absorption peak that depends on the angle of incidence of the light. It has been observed that, with known mirrors, the position and the shape of the absorption peak vary greatly with the angle of incidence of the wave on the detector.

Thus, the article by Cui Dafu et al. cited above describes a quantum efficiency with a very marked angular dependence: it is about 0.1° in the substrate and 0.3° in the incident medium (air). Moreover, the article by Andersson et al. J. Appl. Phys. 171 (1992) 3600 seems to demonstrate a very wide angular response that is insensitive up to at least 15°. However, it is the quantum efficiency integrated over the spectral range from 8 to 12 µm that is considered, and not the quantum efficiency at a given wavelength as a function of the angle of incidence. The latter is more difficult to obtain. It is of interest because it would enable hyperspectral detection, i.e. detection of a plurality of wavelengths in a given detection range (for example 4 different "colors" in the same range 8-12 µm) without color mixing when the radiation arrives at one angle of incidence.

The object of the invention is to overcome the drawbacks of prior-art photodetectors by providing a photodetector comprising a thin semiconductor layer and a structured metal mirror and that has a reduced sensitivity to the angle of incidence of the luminous infrared radiation used, while maintaining the quantum efficiency of the absorption of this luminous radiation, quantified for example by the ratio of the absorbed luminous power in the semiconductor to the incident luminous power.

Thus, the invention relates to a photodetector for detecting luminous radiation of a given wavelength ($\lambda$), comprising a stack of layers with:
- a layer of a semiconductor material that is partially absorbent at said wavelength;
- a spacer layer made of a material that is transparent at said wavelength; and
- a structured metal mirror, the distance (g) between the top of said mirror and said semiconductor layer being smaller than $\lambda$ and said mirror containing an array of holes defining an array of metal protrusions, with a pitch P of between $0.5\,\lambda/nSC$ and $1.5\,\lambda/nSC$, where nSC is the real part of the refractive index of the semiconductor material, a protrusion width L of between $9P/10$ and $P/2$ and a hole depth h of between $\lambda/100$ and $\lambda/15$.

Such a photodetector has a lower angular sensitivity and the spectral width of the resonance is increased.

Moreover, this photodetector makes it possible to envision making it easier to produce matrices of pixels sensitive to different wavelengths (multispectral detection).

This especially results in:
robustness to geometrical variations, especially as regards the fill factor of an array, the effect being observed over a wide range of pads widths;
a structure with a small height that is technologically easy to produce and the optimum value of which varies very little with wavelength; and
the possibility of adjusting the resonant wavelength (i.e. of absorption strengthening) via a lateral dimension of the array (here mainly the pitch of the array) and not via the thickness of the layers.

Lastly, it is not necessary to structure the semiconductor layer.

Preferably, the thickness e of the layer of semiconductor material satisfies the relationship $$e \leq 0.7 \times \frac{\lambda}{2 \times \pi \times kSC};$$

where kSC is the imaginary part of the refractive index of said semiconductor material.

For a photodetector comprising a mirror structured in two dimensions, the pitch P is preferably between 3P/4 and 9P/10.

In a first variant, the array of said mirror contains a set of recessed lines.

In another variant, this array contains two crossed sets of recessed parallel lines. These lines may also optionally be parallel to the edges of the photodetector.

Preferably, the semiconductor material is chosen from Si, Ge, SiGe, Inks, InSb, GaSb, PbS, PbSe, PbTe or $Cd_xHg_{1-x}Te$ (where x<0.9), ternary alloys such as InGaAs, AlInAs, AlInSb, InAsSb or InGaSb, quaternary alloys such as InGaAsP or InGaAsSb and quinternary alloys such as GaIn-AsSbP, or even a type-II super-lattice, for example InAs/InSb on GaSb.

Moreover, the material of the spacer layer is chosen from air, ZnS, CdTe, $SiO_2$ or III-V materials.

It will be chosen so as to be non-absorbent and such that the real part of its index is smaller than the real part of the index of the absorbent semiconductor. Materials with a wider bandgap than that of the absorbent semiconductor will generally meet these requirements.

Advantageously, the spacer layer has a thickness of at least 10 nm, in order to play the role of a diffusion barrier.

Preferably, the distance g is smaller than $\lambda/50$.

Lastly, the photodetector may comprise on said layer of semiconductor material, a substrate that is transparent at said wavelength.

The substrate will, for example, possibly be the substrate on which the absorbent semiconductor layer is grown, for example a CdZnTe substrate in the case of growth of a layer of CdHgTe. The substrate will possibly also contribute to the mechanical cohesion of the final photodetector.

Preferably, this transparent substrate is made of a material the index of which is higher than that of air.

Figure 1:
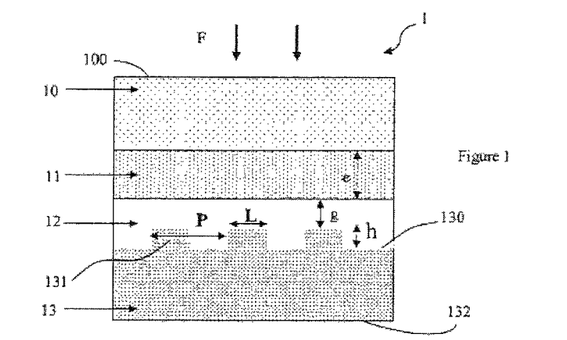
FIG. 1 is a cross-sectional view of an example of a photodetector according to the invention.

The invention will be better understood and other of its aims, advantages and features will become more clearly apparent on reading the following description given with regard to the appended drawings, in which:

FIG. 1 illustrates an example of a photodetector 1 according to the invention.

This photodetector comprises a stack of layers, illustrated in cross section in FIG. 1, with firstly a substrate 10 that is transparent to the wavelength λ of the luminous radiation used.

The arrows F illustrate the propagation of the incident luminous radiation on the front side 100 of the photodetector.

The luminous radiation propagates inside the substrate 10, undergoing refraction on crossing the air/substrate interface, modifying its angle of incidence according to Snell's law. Since the substrate has a higher index than that of air, the angle of incidence in the substrate will be smaller than the angle of incidence in air. This substrate will be used to grow the semiconductor, or indeed as an element ensuring the mechanical cohesion of the photodetector.

This transparent substrate may be made of CdZnTe.

A layer 11 of a semiconductor material is provided in contact with the transparent substrate 10.

The transparent substrate may be omitted in other embodiments of the photodetector according to the invention.

In this case, the fact that the semiconductor layer is left bare decreases the lifetime of the photodetector device, or even induces a high level of photogenerated carrier recombination at the surface of this layer and therefore a decrease in the efficiency with which the photogenerated charge is collected.

To overcome this problem, an electrical passivation layer will then possibly be provided on the layer 11. This layer will necessarily be thin enough not to influence the optical characteristics of the device (typically its thickness will be chosen to be small relative to the wavelength). It may, for example, be a CdTe layer covered with a ZnS layer both of which have a thickness of about 100 nm.

The semiconductor material and its thickness are chosen so that it is partially absorbent.

The thickness e of this layer of semiconductor material is chosen such that the layer 11 of semiconductor is not totally absorbent. It will possibly advantageously respect the following relationship (1)

$$e \leq 0.7 \times \frac{\lambda}{2 \times \pi \times kSC} \quad (1)$$

where kSC is the imaginary part of the refractive index of the semiconductor material.

This material will possibly be chosen from the following materials Si, Ge, SiGe, InAs, InSb, GaSb, PbS, PbSe, PbTe or $Cd_xHg_{1-x}Te$ (where x<0.9), ternary alloys such as InGaAs, AlInAs, AlInSb, InAsSb or InGaSb, quaternary alloys such as InGaAsP, InGaAsSb or GaInAsSb and quinternary alloys such as GaInAsSbP, or even a type-II super-lattice, for example InAs/InSb on GaSb.

It will be noted that the type of doping and its concentration are inconsequential in the context of the invention. This is because the photonic aspect of carrier generation is independent of the collection of these carriers. Therefore it is possible to use any conventional collecting system known in the art.

The stack also comprises a metal mirror 13 and, between the semiconductor layer 11 and the mirror 13, a spacer layer 12.

In the example illustrated in FIG. 1, the mirror comprises, in its surface 130, making contact with the spacer layer 12, a series of protrusions 131. In this case, the top of the mirror 13 corresponds to the top of the highest protrusion 131.

Thus, the distance g between the top of the mirror and the semiconductor layer 11 is chosen to be smaller than the wavelength $\lambda$ of the luminous radiation used.

The structure of the mirror 13 induces a guided mode parallel to the semiconductor layer 11 with an evanescent electric field that is maximal at the top of the mirror and decreases toward the substrate 10. In what is called a near field configuration, the absorbent layer 11 is placed near enough to the mirror that it lies in this region of strengthened electromagnetic field. This corresponds to a distance g from the surface of the mirror of less than $\lambda$.

It will also be shown in the remainder of the description how the value of this distance g influences the angular sensitivity of the photodetector.

The spacer layer 12 is made of a material that is transparent at the wavelength of the luminous radiation used.

This material may be air or even: ZnS, CdTe, or a III-V material depending on the group to which the absorbent semiconductor belongs. Using $SiO_2$ may also be envisioned if the semiconductor used is Ge or SiGe.

Preferably, the distance g is smaller than $\lambda$/ne, where $\lambda$ is the wavelength of the luminous radiation used and where ne is the optical index of the material of the spacer layer 12.

Figure 5:
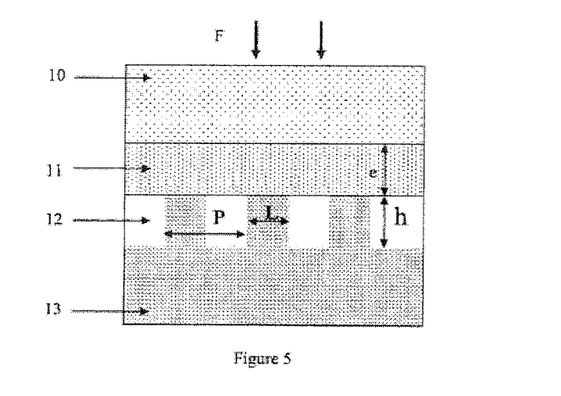
FIG. 5 illustrates another embodiment of the photodetector according to the invention.

As illustrated in FIG. 5, this distance g may be substantially zero.

Consideration will now be given to the structure of the surface 130 of the mirror 13.

Firstly, the structure may be produced in one or two dimension(s).

In the case of a one-dimensional structure, the protrusions 131 form, in the surface 130, lines that are substantially parallel. In other words, the array of the mirror is defined by a set of recessed or protruding lines.

For a mirror of this type, the resonance of the absorption will therefore be generated only for the TM polarization, i.e. when the magnetic field of the incident luminous radiation lies parallel to the lines of the array.

The structure may also be produced in two dimensions, so as to make the photodetector independent of polarization.

The structure then consists in an array of protrusions taking the form of pads, for example a square array of round or square pads, or even a hexagonal array of round pads.

Generally, this array then contains two crossed sets of parallel recessed lines.

Moreover, these lines may optionally lie parallel to the edges of the photodetector.

Another embodiment, in which the structure does not consist of pads protruding from the surface 130 but in holes formed in this surface, is not recommended in the context of the invention.

The mirror 13 may be made of noble metals such as gold, of aluminum, of copper and indeed of any metal provided its conductivity is no more than twenty times lower than that of gold.

The structures will possibly include a thin metal layer serving to ensure the previous metal is tied to the spacer layer 12, for example a layer of titanium Ti.

It has been demonstrated that, in order to obtain a photodetector having a low angular sensitivity, the pitch P of the mirror, i.e. the distance between two consecutive protrusions 131, and the lateral width L and the height h of the protrusions, should also be suitably chosen.

Specifically, the incident light must also couple to the pair of coupled modes guided parallel to the plane of the semiconductor layer, obtained by virtue of the array formed in the mirror. The strength of the latter coupling will for its part be defined by the shape of the array (period or pitch P, fill factor L/P and depth h of the structures). It is preferable for the invention for this array-dependent coupling to be strong in order to obtain a high quantum efficiency detection. The period of the array sets the coordinates (wavelength, angle of incidence) of the resonant peak.

The pitch or the period P of the structure allows the resonant wavelength $\lambda_{rs}$ to be adjusted according to the approximate relationship (2):

$$\lambda_{rs} = nSC \cdot P,$$

where nSC is the real part of the refractive index of the absorbent semiconductor material.

Thus, the pitch P will be chosen to lie in the range from $0.5\lambda/nSC$ to $1.5\lambda/nSC$, where $\lambda$ is the desired resonant wavelength.

In addition, the width L of the protrusions will be chosen to lie between 9P/10 and P/2.

Lastly, the depth of the structure of the mirror, i.e. the height h of the protrusions 131 or even the depth of the holes, will be between $\lambda/15$ and $\lambda/100$ and it will typically be chosen to be substantially equal to $\lambda/50$.

Generally, this height h will be adjusted depending on the thickness e of the semiconductor layer 11 and on the optical index of the spacer layer 12.

These ranges of pitch P, of the lateral width L of the protrusions and the depth h of the holes allow the angular sensitivity of the photodetector to be reduced. This will be illustrated with reference to FIG. 9.

A particular embodiment of a photodetector such as illustrated in FIG. 1 will now be described.

The influence of the various parameters mentioned above will be demonstrated with this particular embodiment, which comprises a mirror structured in one dimension.

Thus, the photodetector in question comprises a transparent substrate layer made of CdZnTe and a mercury cadmium telluride (MCT) semiconductor layer having the general formula $Hg_xCd_{1-x}Te$, where x=0.3.

The wavelength λ of the incident luminous radiation is between 3 and 5 μm. Moreover, the imaginary part of the refractive index of the semiconductor material is about 0.2 for a wavelength of 4 μm. Thus, the relationship (1) yields a thickness for the semiconductor layer smaller than about 2 μm.

In this particular example, the thickness of the semiconductor layer is chosen to be equal to 400 nm.

The layer of spacer material is made of ZnS.

The metal mirror is made of gold and the distance g between the metal mirror and the spacer layer is equal to 50 nm. It is therefore between λ/100 and λ/60 in the adopted wavelength range.

Moreover, the thickness between the surface 130, corresponding to the bottom of the structures, and the bottom of the mirror, corresponding to the surface 132 opposite the surface 130, is at least equal to the skin depth at the wavelength in question. The latter will be about 25 nm for a mirror made of gold at a wavelength of 4 μm.

The pitch of the array is chosen to be equal to 1450 nm and the width L of the metal lines is chosen to be equal to 800 nm. Thus, P is indeed located in the range from 0.5 λ/nSC to 1.5 λ/nSC, in the adopted wavelength range. Furthermore, L is chosen to be substantially equal to 0.55 P.

Lastly, the depth of the structure of the mirror, i.e. the height h, is 125 nm. It is therefore between λ/40 and λ/24 in the wavelength range in question.

Figure 2:
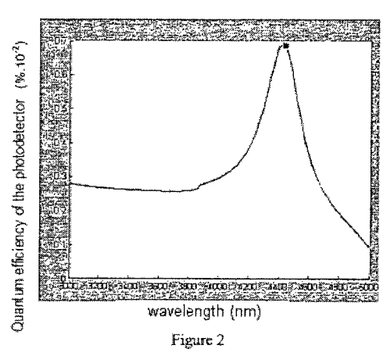
FIG. 2 is a curve showing, for an example of a one-dimensional photodetector according to the invention, the quantum efficiency of the photodetector as a function of wavelength for incident light perpendicular to the photodetector.

FIG. 2 illustrates, for this photodetector embodiment, the quantum efficiency of the photodetector (i.e. the ratio of the power absorbed to the incident power or even the ratio of the number of electron/hole pairs actually generated by absorption in the semiconductor layer to the number of incident photons) as a function of wavelength (expressed in nm), for incident light perpendicular to the photodetector with TM polarization and at an operating temperature of 77 K.

This absorption layer causes a resonant peak to appear, depending on the angle of incidence and the resonant wavelength, which is about 4.44 μm in this case.

This curve shows that the optical absorption in the semiconductor layer is about 70% of the incident power for the resonant wavelength.

In the absence of structuring of the mirror, this absorption would only be 25% of the incident power.

It should be noted that the value of the pitch P allows the resonant wavelength to be adjusted. Thus, in the example considered, varying P between 1.015 μm and 1.6 μm allows the resonant wavelength to be varied between 3.6 and 4.8 μm.

In practice, the resonant wavelength is adjusted by virtue of the geometric parameters of the structure, such as the nature and the thicknesses of the materials making contact with the semiconductor layer, the constituent metal of the structured mirror, the thickness of the semiconductor layer, or the value of g. However, variations in these parameters are of the second order regarding adjustment of the resonant wavelength, relative to the choice of P.

Figure 9:
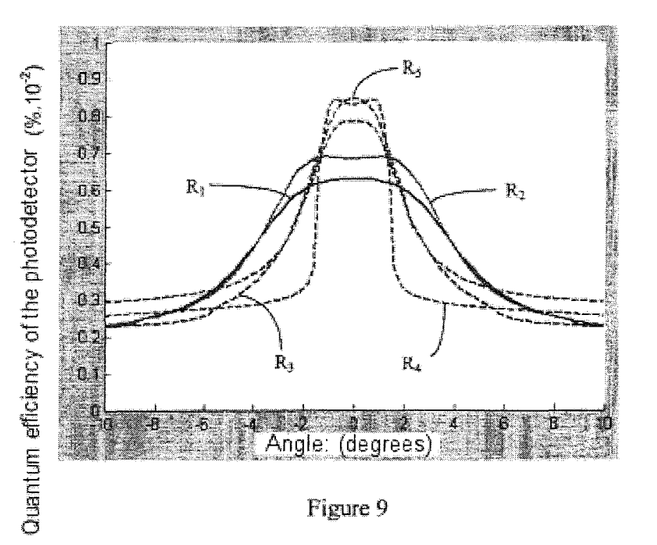
FIG. 9 comprises five curves showing the quantum efficiency of a photodetector depending on the angle of incidence, for various values of the width L of the protrusions and depth h of the holes.

FIG. 9 illustrates the influence of the lateral width L of the reliefs and the hole depth h on the angular sensitivity of the photodetector.

The various curves $R_1$ to $R_5$ give the quantum efficiency of the photodetector as a function of the angle of incidence on the semiconductor layer.

Figure 3:
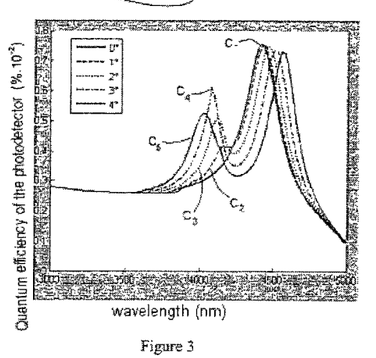
FIG. 3 shows an array of curves similar to those in FIG. 2 corresponding to various angles of incidence.

The curve $R_2$ corresponds to the photodetector taken as a reference in FIGS. 2 and 3. The ratio L/P is equal to 0.55 and h is equal to 125 nm. These two values are in the adopted ranges.

The other curves correspond to a photodetector having the same features, except with respect to the width L and optionally the height h.

Thus, the curve $R_1$ corresponds to a photodetector for which L is equal to 1000 nm and h is equal to 125 nm. The ratio L/P is 0.69. It is indeed located in the adopted range, as is h.

It will be observed that the angular sensitivity of this photodetector is substantially identical to that of the photodetector corresponding to the curve $R_2$.

The curve $R_3$ corresponds to a photodetector for which L is equal to 600 nm and h is equal to 170 nm. The ratio L/P is 0.41 and is not in the adopted range, in contrast to h.

Lastly, the curve $R_4$ corresponds to a photodetector for which L is equal to 350 nm and h is equal to 600 nm. The ratio L/P is 0.24. This ratio, like h, is not in the adopted ranges.

Lastly, the curve $R_5$ corresponds to a photodetector for which L is equal to 700 nm and h is equal to 700 nm. The ratio L/P is 0.48. This ratio and h are also not in the adopted ranges.

Thus, for the set of curves $R_3$ to $R_5$, the ratio L/P is not in the adopted range 9P/10-P/2 and, for the curves $R_4$ and $R_5$, h is also not in the adopted range λ/100-λ/15.

Comparing the curves $R_1$ and $R_2$ on the one hand and $R_3$, $R_4$ and $R_5$ on the other hand, shows that the quantum efficiency of the photodetector is invariant over a range of angles of incidence that substantially decreases when the ratio L/P is smaller than 0.5 and/or the value of h is higher than λ/15.

Reference is now made to FIG. 3, which illustrates an array of curves similar to the curve in FIG. 2, and corresponding to angles of incidence varying between 0 and 4°. These curves were obtained with a photodetector identical to the example described above and corresponding to FIG. 2.

Thus, the curve $C_1$ drawn with a solid line corresponds to the curve illustrated in FIG. 2. The luminous radiation is therefore perpendicular to the surface of the photodetector.

The curve $C_2$ also corresponds to a curve showing the quantum efficiency of the photodetector as a function of wavelength, but for incident light on the layer 11 at an angle of 1° to the normal.

Likewise, the curve $C_3$ corresponds to a variation in the angle of incidence of 2°, the curve $C_4$ to a variation of 3° and the curve $C_5$ to a variation of 4°.

This set of curves shows that the quantum efficiency of the photodetector does not vary as a function of the angle of incidence, if this variation is ±1.5° in the transparent substrate 10, corresponding to a variation of ±4° in air.

According to another criteria of the sensitivity to the angle of incidence for a given wavelength, for example 4.4 μm, the response of the detector is divided substantially by two for a variation in the angle of incidence greater than ±4° in the substrate 10, i.e. ±10° in air.

Figure 6:
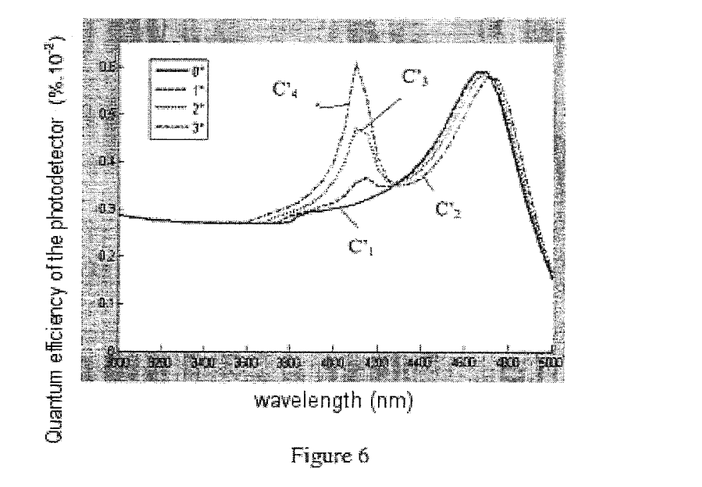
FIG. 6 shows an array of curves showing, as a function of wavelength and for incident light at several angles of incidence, the quantum efficiency of another example of a one-dimensional photodetector comprising a transparent substrate.
Figure 7:
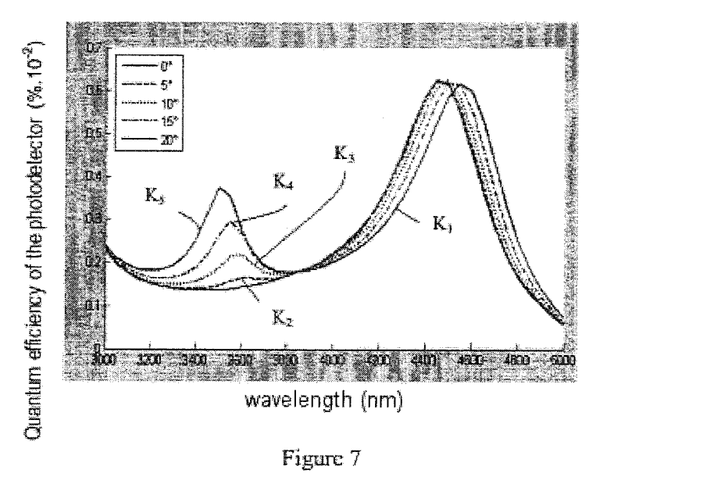
FIG. 7 shows an array of curves similar to those in FIG. 6 and for a photodetector that does not comprise a transparent substrate.

With reference to FIGS. 6 and 7, the angular sensitivities of a photodetector comprising a transparent substrate 10 made of CdZnTe (FIG. 6) and a photodetector comprising no transparent substrate (FIG. 7) will now be compared.

In both cases, the photodetectors are one-dimensional and comprise an MCT semiconductor layer the thickness of which is 400 nm.

The metal mirror is made of gold, the height of the protrusions is 125 nm for the photodetector comprising a CdZnTe substrate and 225 nm for that which does not comprise one thereof.

Moreover, the thickness between the bottom of the structures and the bottom of the mirror will for example be 100 nm. It is here larger than the skin depth of the metal at the wavelength in question, which is 25 nm for gold.

The distance g between the metal mirror and the spacer layer is 50 nm.

Moreover, the pitch P of the array is chosen to be equal to 1450 nm and the width L of the protrusions or lines is chosen to be equal to 1000 nm.

In FIG. 6, the curve C'$_1$ drawn with the solid line illustrates the quantum efficiency of the photodetector with the CdZnTe substrate, as a function of wavelength, for a luminous radiation perpendicular to the surface of the photodetector and for an operating temperature of 77K.

The curve C'$_2$ is a similar curve for an angle of incidence of 1°.

The curves C'$_3$ and C'$_4$ correspond to a variation in the angle of incidence of 2° and of 3°, respectively, relative to the perpendicular to the surface of the photodetector.

In FIG. 7, the curve K$_1$ drawn with the solid line illustrates the quantum efficiency of the substrateless photodetector, as a function of wavelength, for luminous radiation perpendicular to the surface of the photodetector and for the same operating temperature.

The curves K$_2$ to K$_5$ are similar curves corresponding to a variation in the angle of incidence of 5°, 10°, 15° and 20°, respectively, relative to the perpendicular to the surface of the photodetector.

Comparing the two sets of curves C'$_1$ to C'$_4$ and K$_1$ to K$_5$ shows that the substrateless photodetector is less sensitive to the angle of incidence of the luminous radiation than the photodetector that comprises a CdZnTe substrate.

Specifically, the response of the photodetector varies by substantially the same amount for a variation in the angle of incidence between 0° and 15° for the substrateless photodetector and between 0° and 2° for the photodetector with a substrate (which corresponds to a variation between 0° and 5° in the air present above the substrate).

However, the photodetector with a substrate has the advantage of being more mechanically robust.

Figure 4:
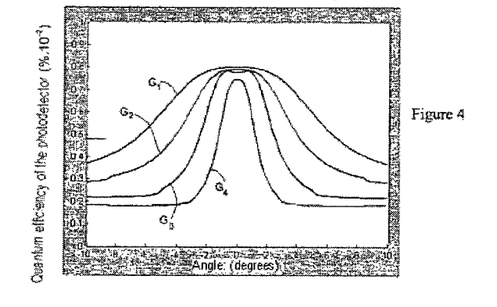
FIG. 4 shows four curves plotting the quantum efficiency of a photodetector according to the invention, as a function of the angle of incidence, for various values of the parameter g.

Reference is now made to FIG. 4 which shows several curves allowing the quantum efficiency of the photodetector to be compared, as a function of the angle of incidence on the semiconductor layer, for various values of the parameter g.

The photodetector in question has the same characteristics as that taken as a reference in FIGS. 2 and 3 as regards the values of e, P and L/P.

The value h adopted here is between 125 and 150 nm.

In contrast, the parameter g is here modified in each of the photodetectors considered.

Thus, the curve G$_1$ corresponds to a photodetector for which g is equal to 10 nm. For the curve G$_2$, g is equal to 50 nm, for the curve G$_3$, g is equal to 160 nm and for the curve G$_4$, g is equal to 300 nm.

Thus, the curve G$_2$ corresponds to that which is obtained with the photodetector described above and with which FIGS. 2 and 3 are associated. It corresponds to the curve R$_2$ in FIG. 9.

All these curves are obtained for incident luminous radiation with a wavelength equal to the resonant wavelength, which varies from 4.05 to 4.65 µm as g decreases.

Comparing curves G$_1$ to G$_4$ shows that, at the resonant wavelength, the quantum efficiency of the photodetector is invariant over a range of variations in angle of incidence that narrows from curve G$_1$ to curve G$_4$.

Thus, it may be considered that, for a detector having a value of g equal to 10 nm, its response does not vary for a variation in the angle of incidence of ±2°.

For a detector having a value of g equal to 300 nm, the response of the detector will remain insensitive to a variation in the angle of incidence of only ± about 0.3°.

The curves G$_1$ and G$_4$ therefore show that it is possible to improve angular sensitivity by a factor of 6.

The performance of the photodetector, i.e. its angular sensitivity, may be considered to be defined by the width of the absorption-angle curve at the half maximum of the curve.

By way of indication, this performance may be considered to be good when the width of the curve corresponds to an angular amplitude of about 5°.

On the basis of the data in FIG. 4, and by extrapolation, this would correspond to a value of g of about 80 nm, i.e. about λ/50.

Consideration will now be given to a photodetector comprising a mirror structured in two dimensions.

The various parameters of the array of pads will lie in the ranges defined above.

However, it turns out that to obtain a single resonant peak in the curve of photodetector quantum efficiency as a function of wavelength it is preferable for the width L to be between 9P/10 and 3P/4 and, preferably, for it to be equal to 4P/5, in order to optimize the compromise between maximizing the quantum efficiency of the detector and lowering the energy of the secondary resonance at lower wavelengths.

Figure 8A:
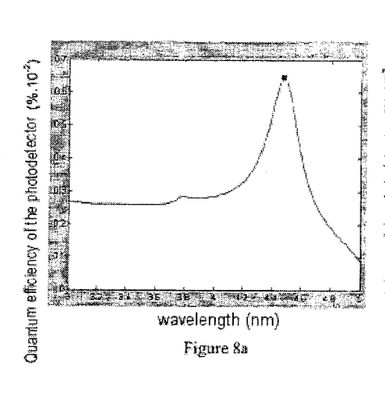
FIGS. 8a and 8b are each a curve showing, as a function of wavelength, the quantum efficiency of two photodetectors according to the invention comprising a mirror structured in two dimensions and for incident light perpendicular to the photodetector.
Figure 8B:
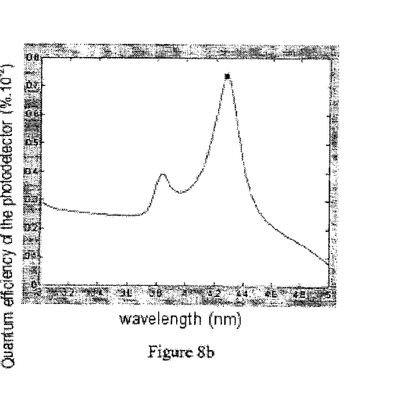

This may clearly be seen in FIGS. 8a and 8b in particular.

FIG. 8a is a curve showing the quantum efficiency of the photodetector as a function of wavelength for a photodetector according to the invention having a mirror made of gold structured in two dimensions.

Its characteristics are identical to those of the photodetector described with reference to FIG. 1 and used in FIGS. 2 and 3 (thickness of the MCT layer equal to 400 nm; g=50 nm; h=125 nm), the material is ZnS and the substrate is made of CdZnTe, and the mirror comprises square-shaped pads with a width L of 1200 nm and a pitch P of 1450 nm.

FIG. 8b is the corresponding curve for a photodetector that is identical to that used in FIG. 8a, except as regards the width L of the pads, which is here 800 nm.

Comparing FIGS. 8a and 8b shows that the photodetector having a width L substantially equal to 4P/5 (FIG. 8a) allows a single resonant peak to be obtained in contrast to the photodetector having a width L substantially equal to P/2 (FIG. 8b).

The reference numbers inserted after the technical features of the claims are merely intended to aid comprehension of the claims and in no way limit their scope.

The invention claimed is:

1. A photodetector for detecting luminous infrared radiation of a given wavelength (λ), comprising a stack of layers with: a layer of a partially absorbent semiconductor material; a spacer layer made of a material that is transparent at said wavelength; and a metal mirror structured in two dimensions, the distance (g) between the top of said mirror and said semiconductor layer being smaller than λ, and said mirror containing an array of holes defining an array of metal protrusions with a pitch P of between 0.5 λ/nSC and 1.5 λ/nSC, where nSC is the real part of the refractive index of the semiconductor material, a protrusion width L of between 9P/10 and 3P/4 and a hole depth h of between λ/100 and λ/15.

2. The photodetector as claimed in claim 1, in which the thickness (e) of the layer of semiconductor material satisfies the relationship $$e \leq 0.7 \times \frac{\lambda}{2 \times \pi \times kSC};$$

where kSC is the imaginary part of the refractive index of said semiconductor material.

3. The photodetector as claimed in claim 1, in which the array of said mirror contains a set of recessed lines.

4. The photodetector as claimed in claim 1, in which the array of said mirror contains two crossed sets of recessed and parallel lines.

5. The photodetector as claimed in claim 1, comprising a mirror structured in two dimensions, in which the protrusion width L is equal to 4P/5.

6. The photodetector as claimed in claim 1, in which the semiconductor material is chosen from Si, Ge, SiGe, InAs, InSb, GaSb, PbS, PbSe, PbTe or $Cd_xHg_{1-x}Te$ (where x<0.9), ternary alloys such as InGaAs, AlInAs, AlInSb, InAsSb or InGaSb, quaternary alloys such as InGaAsP or InGaAsSb and quinternary alloys such as GaInAsSb or GaInAsSbP, or even a type-II super-lattice.

7. The photodetector as claimed in claim 1, in which the material of the spacer layer is chosen from air, ZnS, CdTe, SiO2 or III-V materials.

8. The photodetector as claimed in claim 1, in which the spacer layer has a thickness of at least 10 nm.

9. The photodetector as claimed in claim 1, comprising, on said layer of semiconductor material, a substrate that is transparent at said wavelength.

10. The photodetector as claimed in claim 1, in which said distance g is smaller than $\lambda/50$.

\* \* \* \* \*